(12) United States Patent
Nishihara

(10) Patent No.: US 12,113,029 B2
(45) Date of Patent: Oct. 8, 2024

(54) SEMICONDUCTOR DEVICE AND MANUFACTURING METHOD THEREOF

(71) Applicant: Mitsubishi Electric Corporation, Tokyo (JP)

(72) Inventor: Tatsuto Nishihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 521 days.

(21) Appl. No.: 17/434,589

(22) PCT Filed: Apr. 5, 2019

(86) PCT No.: PCT/JP2019/015156
§ 371 (c)(1),
(2) Date: Aug. 27, 2021

(87) PCT Pub. No.: WO2020/202556
PCT Pub. Date: Oct. 8, 2020

(65) Prior Publication Data
US 2022/0139844 A1 May 5, 2022

(51) Int. Cl.
| | |
|---|---|
| *H01L 23/552* | (2006.01) |
| *H01L 21/48* | (2006.01) |
| *H01L 21/56* | (2006.01) |
| *H01L 23/00* | (2006.01) |
| *H01L 23/29* | (2006.01) |

(Continued)

(52) U.S. Cl.
CPC ........ *H01L 23/552* (2013.01); *H01L 21/4853* (2013.01); *H01L 21/565* (2013.01); *H01L 23/295* (2013.01); *H01L 23/3121* (2013.01); *H01L 23/3135* (2013.01); *H01L 23/49838* (2013.01); *H01L 24/48* (2013.01);
(Continued)

(58) Field of Classification Search
None
See application file for complete search history.

(56) References Cited

U.S. PATENT DOCUMENTS

| | | | |
|---|---|---|---|
| 2010/0327427 A1 | 12/2010 | Kimura et al. | |
| 2017/0103905 A1* | 4/2017 | Oratti Kalandar | ...... H01L 21/78 |
| 2018/0233422 A1* | 8/2018 | Gurrum | ............... H01L 23/295 |

FOREIGN PATENT DOCUMENTS

| | | |
|---|---|---|
| CN | 106960801 A | 7/2017 |
| CN | 107622980 A | 1/2018 |

(Continued)

OTHER PUBLICATIONS

International Search Report issued in PCT/JP2019/015156; mailed Jun. 11, 2019.

(Continued)

*Primary Examiner* — Long Pham
(74) *Attorney, Agent, or Firm* — Studebaker & Brackett PC

(57) ABSTRACT

A first molded resin containing first insulating fillers having particle sizes smaller than the opening size of a wire mesh is formed inside the wire mesh to seal a semiconductor chip, bonding wires, and bond pads, and a second molded resin containing second insulating fillers having particle sizes larger than the opening size of the wire mesh is formed outside the wire mesh to seal the semiconductor ship, the bonding wires, and the bond pads via the first molded resin and the wire mesh. This allows for reducing warpage during solder mounting and for improving productivity.

6 Claims, 15 Drawing Sheets

(51) Int. Cl.
H01L 23/31 (2006.01)
H01L 23/498 (2006.01)

(52) U.S. Cl.
CPC ............... *H01L 2224/48227* (2013.01); *H01L 2924/3025* (2013.01)

(56) References Cited

FOREIGN PATENT DOCUMENTS

| | | | |
|---|---|---|---|
| CN | 108010902 A | 5/2018 |
| JP | H06-275741 A | 9/1994 |
| JP | H07-111299 A | 4/1995 |
| JP | H07-321254 A | 12/1995 |
| JP | 2011-009604 A | 1/2011 |
| JP | 2012-174912 A | 9/2012 |
| JP | 2018-019067 A | 2/2018 |

OTHER PUBLICATIONS

An Office Action mailed by the State Intellectual Property Office of the People's Republic of China on Dec. 8, 2023, which corresponds to Chinese Patent Application No. 201980049328.5 and is related to U.S. Appl. No. 17/434,589; with English language translation.

An Office Action mailed by China National Intellectual Property Administration on Mar. 28, 2024, which corresponds to Chinese Patent Application No. 201980094328.5 and is related to U.S. Appl. No. 17/434,589; with English language translation.

\* cited by examiner

SEMICONDUCTOR DEVICE AND MANUFACTURING METHOD THEREOF

TECHNICAL FIELD

The present application relates to a semiconductor device and a method of manufacturing the same.

BACKGROUND ARTS

Conventionally, a resin-sealed semiconductor device for mobile phone use, in-vehicle use, and the like use, which is liable to be affected by external nose, and a resin-sealed semiconductor device acting as a noise source, have a plastic case coated with an anti-noise electric-field shielding ink to protect the semiconductor chip mounted on the substrate or have a metal electromagnetic-shielding case to shroud the semiconductor chip mounted on the substrate (see, for example, Patent Document 1).

Mobile phones typified by smart phones, in particular, have required addition of electromagnetic shielding function to the resin-sealed semiconductor device for the purpose of reducing thickness, reducing parts count, reducing manufacturing cost, and the like. A semiconductor device is disclosed for this requirement, in which a cured resin is formed from a two-layer thermosetting resin of different compositions containing conductive fillers in the second layer (see, for example, Patent Document 2).

PRIOR ART DOCUMENTS

Patent Documents

Patent Document 1; JPH07-321254A (paragraphs [0009] to [0013], and FIG. 1); and
Patent Document 2: JP2018-019067A (paragraph [0089], and FIG. 1).

SUMMARY OF THE INVENTION

Problem that the Invention is to Solve

In Patent Document 1, however, a resin material is injected through the openings of a metal mesh plate, thus posing a problem of reduction in flowability of the resin material. Furthermore, reducing the average particle size of the insulating fillers contained in the resin material to improve the flowability lowers the elastic modulus of the cured resin, thus posing a problem of occurrence of warpage caused by heating during solder mounting.

In Patent Document 2, since the cured resin is formed from the two-layer thermosetting resin, the forming steps are increased and manufacturing cost and time are increased, thus posing a problem of reducing productivity efficiency.

The present application discloses a technology for resolving the above-described problems and is aimed at providing a semiconductor device and a method of manufacturing the same that allow not only for reducing warpage occurring during solder mounting but also for improving flowability of the resin material during molding and for reducing manufacturing cost and time.

Means for Solving the Problem

A semiconductor device disclosed in the present application includes a semiconductor chip bonded to a surface of a substrate; bonding wires connecting the semiconductor chip to bond pads formed on the surface of the substrate; a grounded pad formed so as to surround the semiconductor chip and the bond pads; a basket-shaped wire mesh covering the semiconductor chip, the bonding wires, and the bond pads, and joined to the grounded pad; a first molded resin containing first fillers having particle sizes smaller than an opening size of the wire mesh, and sealing, inside of the wire mesh, the semiconductor chip, the bonding wires, and the bond pads; and a second molded resin containing second fillers having particle sizes larger than the opening size of the wire mesh, and sealing, outside the wire mesh and via the first molded resin and the wire mesh, the semiconductor chip, the bonding wires, and the bond pads.

A method of manufacturing the semiconductor device disclosed in the present application includes the steps of bonding a semiconductor chip to a surface of a substrate; connecting the semiconductor chip to bond pads formed on the surface of the substrate using bonding wires; joining to grounded pad formed on the surface of the substrate a basket-shaped wire mesh configured to cover the semiconductor chip, the bonding wires, and the bond pads; injecting into a cavity of the molding die through a gate of the molding die a resin material containing first fillers having particle sizes smaller than an opening size of the wire mesh and second fillers having particle sizes larger than the opening size of the wire mesh after mounting the substrate inside a molding die, to fill a space inside the wire mesh with a resin material containing only the first fillers selectively separated by the wire mesh and to fill a space outside the wire mesh with a resin material containing the second fillers; and forming inside the wire mesh a first molded resin sealing the semiconductor chip, the bonding wires, and the bond pads, and forming outside the wire mesh a second molded resin sealing the first molded resin and the wire mesh, by thermally curing the resin materials.

A method of manufacturing the semiconductor device disclosed in the present application includes the steps of bonding a semiconductor chip to a surface of a substrate; connecting the semiconductor chip to bond pads formed on the surface of the substrate using bonding wires; placing on a grounded pad formed on the surface of the substrate a wire mesh having a basket-shaped part and a flange part, configured to cover the semiconductor chip, the bonding wires, and the bond pads, after placing the substrate in a first molding die; fitting a second molding die on the first molding die with the flange part being held down to the substrate; injecting, into a cavity of the molding die through a gate formed between the first molding die and the second molding die, a resin material containing insulating fillers having particle sizes smaller than an opening size of the basket-shaped part and conductive fillers having particle sizes larger than the opening size of the basket-shaped part, to fill a space inside the basket-shaped part with a resin material containing only the insulating fillers selectively separated by the wire mesh and to fill a space outside the wire mesh with a resin material containing the conductive fillers; and forming inside the wire mesh a first molded resin sealing the semiconductor chip, the bonding wires, and the bond pads and forming outside the basket-shaped part a second molded resin sealing the first molded resin and the wire mesh by thermally curing the resin materials.

Advantageous Effect of the Invention

According to the present application, since a wire mesh for covering a semiconductor chip and other components is mounted on the surface of the substrate and molded resins are formed from a resin material with different particle-size fillers contained therein being selectively separated by the wire mesh during injection of the resin material, thus allowing not only for reducing warpage occurring during solder mounting but also for improving flowability of the resin material during the injection and for reducing the manufacturing cost and time.

DETAILED DESCRIPTION OF THE INVENTION

Embodiment 1

Figure 1:
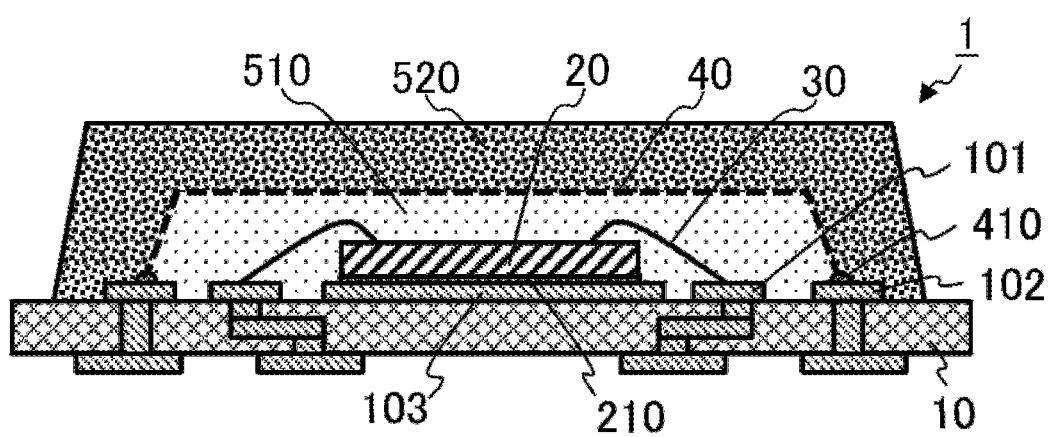
FIG. 1 is a sectional view showing a configuration of a semiconductor device according to Embodiment 1.
Figure 2:
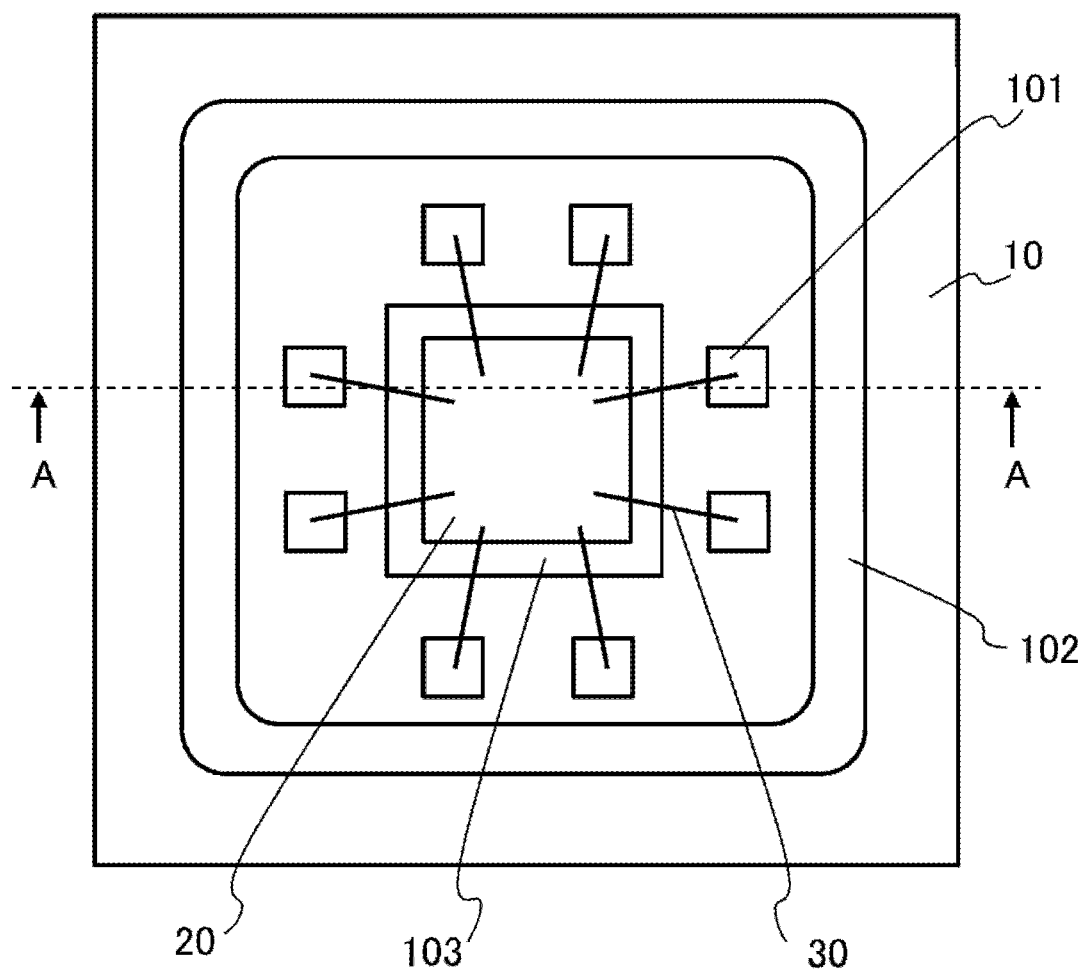
FIG. 2 is a plan view showing the configuration of the semiconductor device according to Embodiment 1.
Figure 3A:
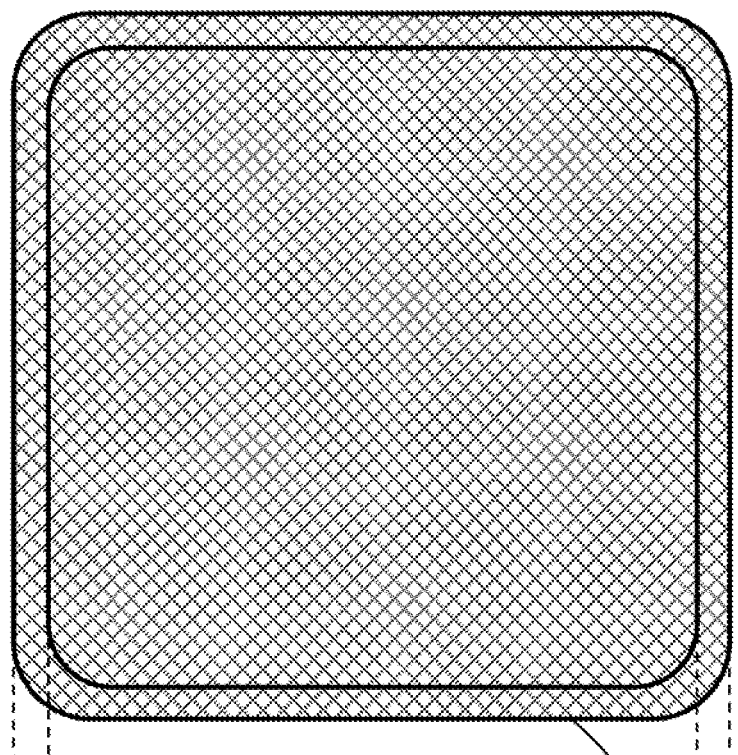
FIGS. 3A and 3B are a plan view and a side view showing a shape of a wire mesh used in the semiconductor device according to Embodiment 1.
Figure 3B:
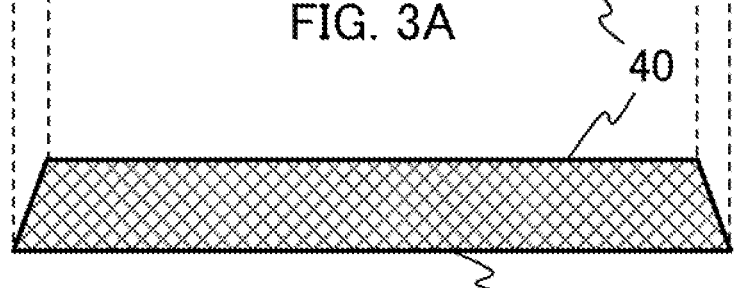

FIG. 1 is a sectional view taken in the direction of the arrows along the line A-A of FIG. 2, showing a configuration of a semiconductor device 1 according to Embodiment 1 of the present application. FIG. 2 is a plan view of the semiconductor device 1 with a wire mesh not yet being mounted therein. FIG. 3A is a plan view of the wire mesh used in the semiconductor device 1, and FIG. 3B is a side view thereof.

As shown in FIG. 1 and FIG. 2, the semiconductor device 1 includes a substrate 10 having bond pads 101, a die pad 103 and a grounded pad 102 formed thereon; a semiconductor chip 20 bonded to the die pad 103 on a surface of the substrate 10 with a bonding material 210; bonding wires 30 connecting the surface electrodes (not shown) of the semiconductor chip 20 to the bond pads 101 by wire bonding; a first molded resin 510 covering the semiconductor chip 20, the bond pads 101, and the bonding wires 30; the wire mesh 40 covering the first molded resin 510 and connected with the grounded pad 102 on the substrate 10; and a second molded resin 520 covering the wire mesh 40.

On the substrate 10, the die pad 103 is disposed to mount the semiconductor chip 20 and the bond pads 101 are disposed to be connected to the semiconductor chip 20 by the bonding wires 30, and the grounded pad 102 is disposed so as to surround the bond pads 101 and the semiconductor chip 20.

The semiconductor chip 20 is bonded to the die pad 103 disposed on the substrate 10 with the bonding material 210 such as a solder or an adhesive. The semiconductor chip 20 has the electrodes on its surface and the electrodes are connected to the bond pads 101 disposed on the substrate 10 by the bonding wires 30.

The bonding wires 30 connect the surface electrodes on the semiconductor chip 20 to the bond pads 101 by wire bonding.

The wire mesh 40 is shaped into a basket having a hollow 40a as shown in FIGS. 3A, 3B, and is placed so as to cover the semiconductor chip 20, the bond pads 101 and the bonding wires 30 and joined to the grounded pad 102 with a joining material 410 such as a solder or a conductive adhesive.

The first molded resin 510 and the second molded resin 520 are formed by thermally curing a resin material composed of an organic resin such as epoxy resin and of insulating fillers such as silica using, for example, a transfer molding or an injection molding, to insulatingly seal the semiconductor chip 20, the bond pads 101, and the bonding wires 30. The first molded resin 510 contains first insulating fillers that have particle sizes smaller than the opening size of the wire mesh 40 and pass through the openings thereof, and the second molded resin 520 mainly contains second insulating fillers that have particle sizes larger than the opening size of the wire mesh 40 and do not pass through the openings thereof. For example, it is preferable that the opening size of the wire mesh 40 is 0.05 mm, and the particle sizes of the insulating fillers contained in the first molded resin 510 is 0.001 to 0.03 mm and the particle sizes of the insulating fillers contained in the second molded resin 520 is 0.1 to 0.15 mm. Moreover, the total content of both insulating fillers containing in the resin material is preferably 70 to 90 wt %.

Figure 4:
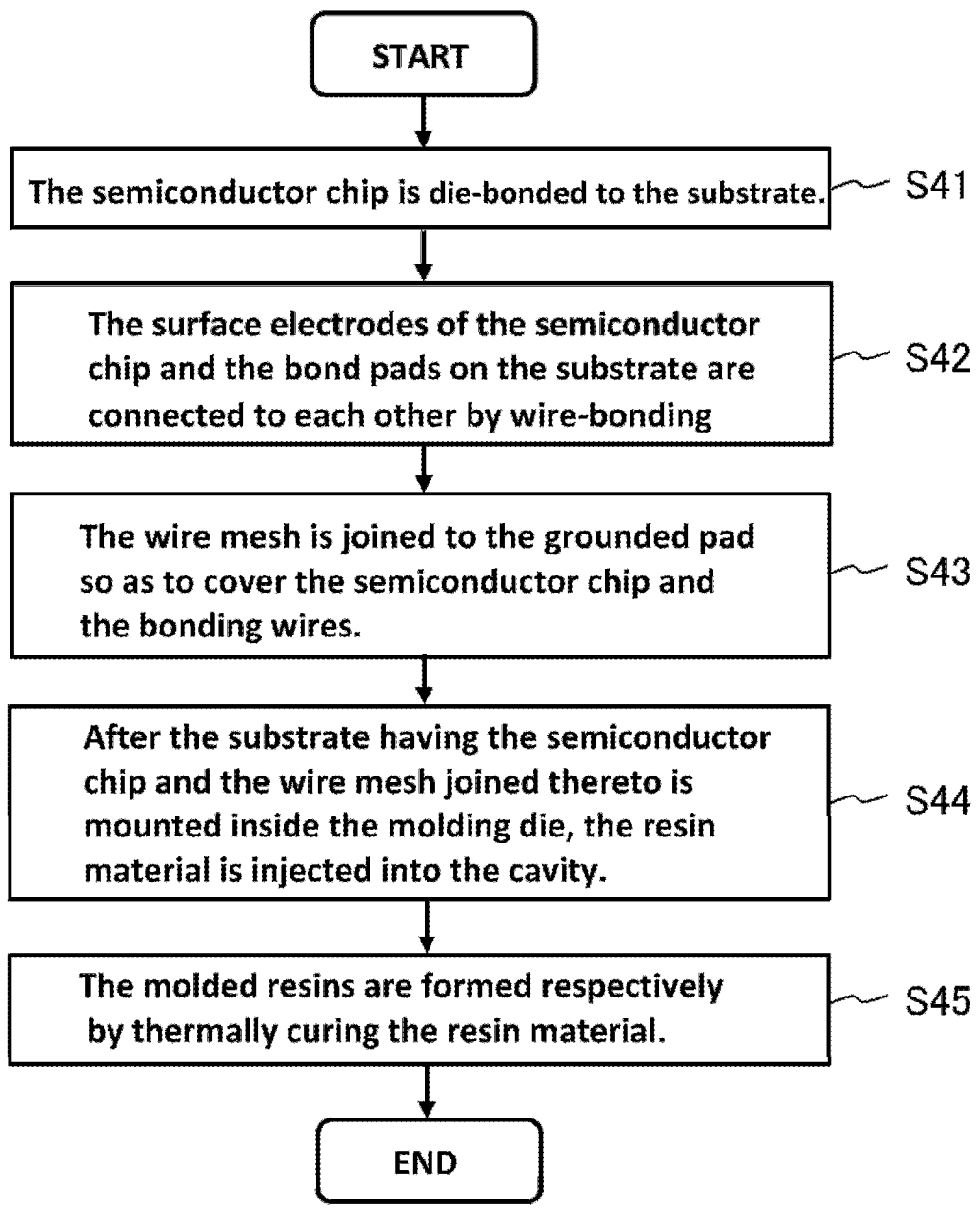
FIG. 4 is a flowchart showing steps of manufacturing the semiconductor device according to Embodiment 1.

Next, a method of manufacturing the semiconductor device 1 according to Embodiment 1 is described with reference to FIG. 4 to FIG. 6. FIG. 4 is a flowchart showing steps of manufacturing the semiconductor device 1 according to Embodiment 1. FIGS. 5A to 5E are sectional views respectively illustrating the steps of manufacturing the semiconductor device 1. FIG. 6 is an enlarged sectional view illustrating one of the steps of manufacturing the semiconductor device 1.

Figure 5A:
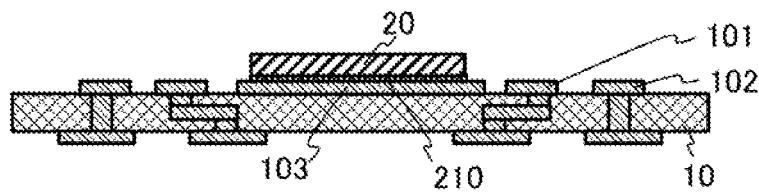
FIGS. 5A to 5E are sectional views respectively illustrating the steps of manufacturing the semiconductor device according to Embodiment 1.
Figure 6:
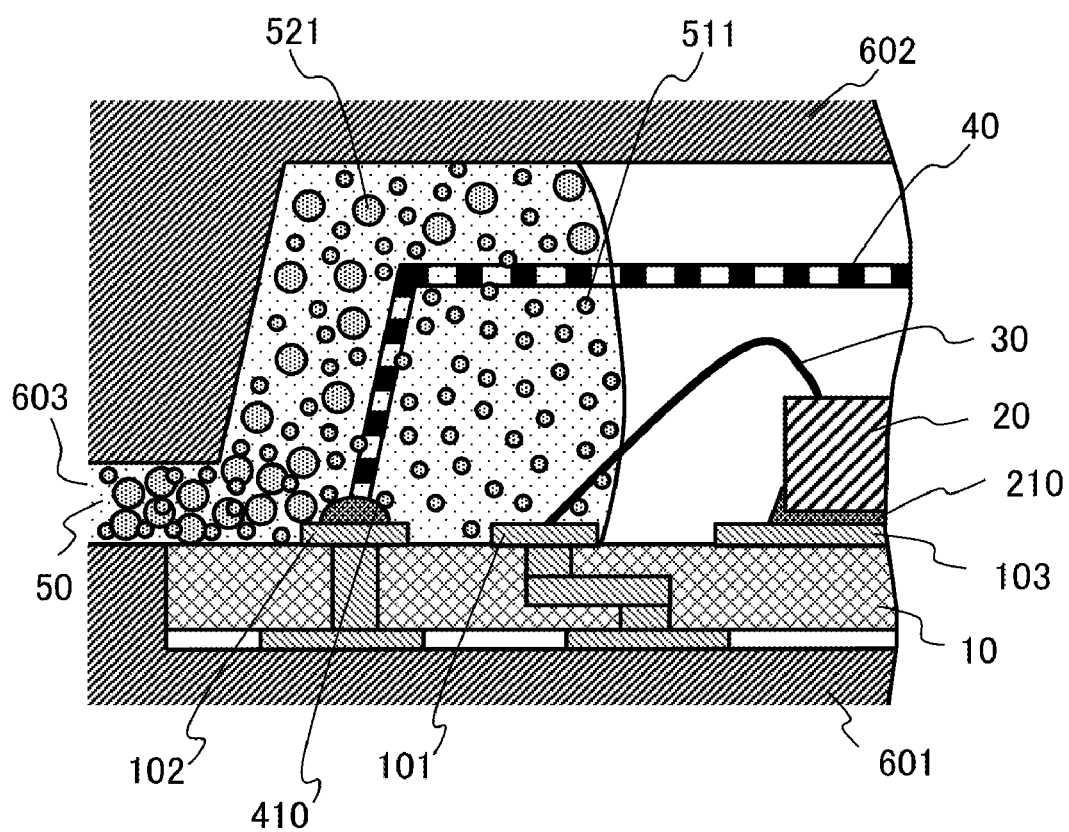
FIG. 6 is an enlarged sectional view illustrating one of the steps of manufacturing the semiconductor device according to Embodiment 1.

First, the substrate 10 having the bond pads 101, the die pad 103, and the grounded pad 102 is prepared, and the semiconductor chip 20 is bonded (die-bonded) to the surface of the die pad 103 with the bonding material 210 such as a solder or an adhesive, as shown in FIG. 5A (Step S41 in FIG. 4).

Figure 5B:
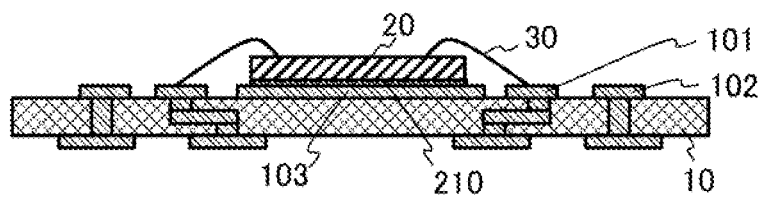

Subsequently, the surface electrodes of the semiconductor chip 20 and the bond pads 101 on the substrate 10 are connected to each other by wire-bonding using the bonding wires 30, as shown in FIG. 5B (Step S42 in FIG. 4).

Figure 5C:
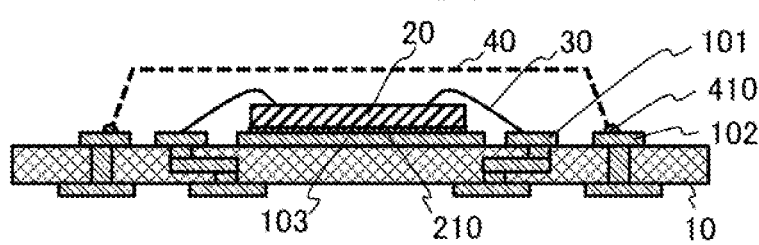

Next, the wire mesh 40 is placed on the surface of the grounded pad 102 so as to cover the semiconductor chip 20, the bond pads 101, and the bonding wires 30, and then joined to the grounded pad 102 with a joining material 410 such as a solder or a conductive adhesive, as shown in FIG. 5C (Step S43 in FIG. 4).

Figure 5D:
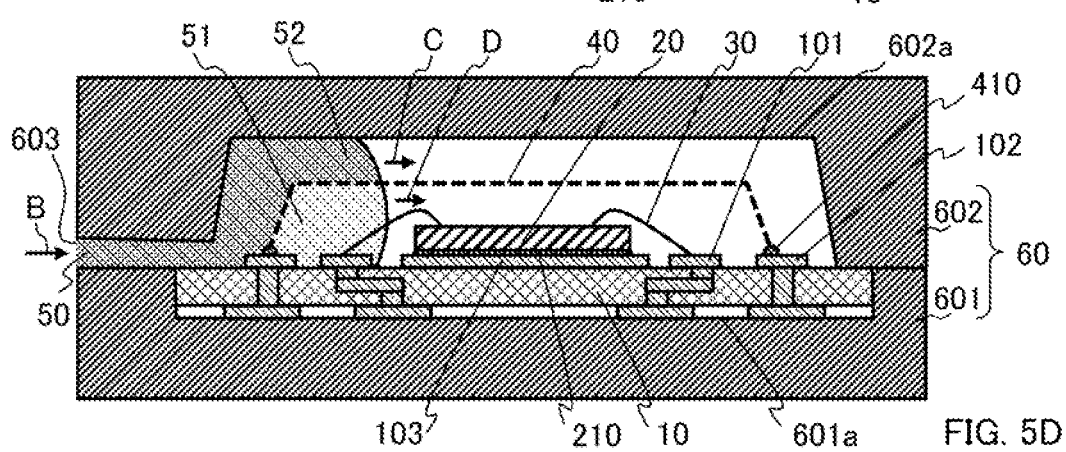

Subsequently, after the substrate 10 having the wire mesh 40 joined thereto is placed in the depression 601*a* of the a first lower molding die 601 of a molding die 60 and a second upper molding die 602 thereof is fitted on the first lower molding die 601 for the wire mesh 40 to be mounted inside the molding die 60 so that the wire mesh 40 is accommodated in the depression (cavity) 602*a* of the second molding die 602, the resin material 50 is injected from the direction B into the cavity 602*a* through a gate 603 of the second molding die, as shown in FIG. 5D (Step S44 in FIG. 4).

When the flowing resin material 50 having passed through the gate 603 reaches the wire mesh 40, the wire mesh 40 selectively separates the insulating fillers contained in the resin material 50, as shown in FIG. 6. Specifically, part of the first insulating fillers 511 smaller than the opening size of the wire mesh 40 pass through the openings thereof along with the organic resin and flows in the direction D as a first resin material 51 for covering the semiconductor chip 20 and the bonding wires 30, so that the space inside the wire mesh 40 is filled with the first resin material. On the other hand, a resin material containing the rest of the small-size first insulating fillers 511 not passing through the openings of the wire mesh 40 and the second insulating fillers 521 larger than the opening size flows in the direction C as a second resin material 52 for covering the outside of the wire mesh 40, so that the space outside the wire mesh 40 is filled with the second resin material.

Figure 5E:
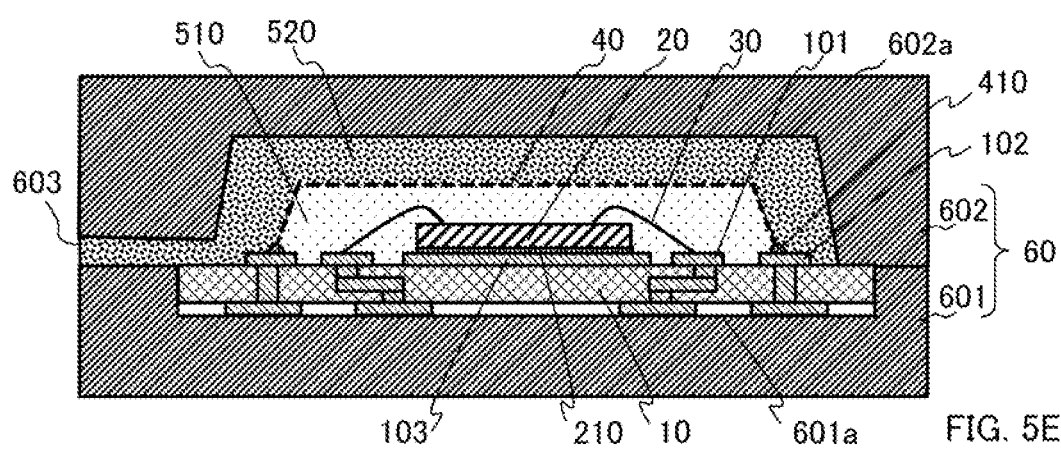

Finally, after the cavity 602*a* is fully filled with the first resin material 51 and the second resin material 52 each injected as the resin 50, the first molded resin 510 directly sealing the semiconductor chip 20 and the bonding wires 30 and the second molded resin 520 indirectly sealing them from outside the wire mesh 40 are formed respectively by thermally curing the first resin material 51 and second resin material 52, as shown in FIG. 5E (Step S45 in FIG. 4).

Since the first resin material 51 containing the first insulating fillers 511 having the particle sizes smaller than the opening size of the wire mesh 40 and having passed through the openings thereof flows inside the wire mesh in this way to form the first molded resin 510 directly sealing the semiconductor chip 20 and the bonding wires 30, the content of the fillers in the first resin material becomes lower, whereby the viscosity thereof is reduced and the flowability thereof is improved during injection of the resin material, thus being able to prevent scratches from occurring on the surface of the semiconductor chip and to prevent flexure and the like of the bonding wires. Moreover, since the first molded resin becomes reduced in elastic modulus (becomes softer) after cured, the stress caused by heating during solder mounting such as by reflow soldering is relieved, thus being able to prevent occurrence of a package crack originated from the semiconductor chip.

Furthermore, since the second molded resin 520 indirectly sealing the semiconductor chip 20 and the bonding wires 30 via the first molded resin 510 and the wire mesh 40 is formed from the second resin material 52 containing mainly the second insulating fillers 521 having particle sizes larger than the opening size of the wire mesh 40 and not passing through the openings thereof, the content of the fillers in the second molded resin becomes higher and the average particle size of the fillers also becomes larger, whereby the second molded resin becomes increased in elastic modulus (becomes harder) after cured, thus bringing about an effect of reducing warpage caused by heating during solder mounting.

In Patent Document 1, the metal mesh plate having opening size of 0.2- to 0.5-mm square is encapsulated in the sealing resin. The noise shielding effect by the openings can be estimated using a formula for calculating an attenuation level for a plane wave. Table 1 shows the estimation of attenuation levels for plane waves at four representative frequencies in a range of 3 to 28 GHz used for the fifth generation mobile communication system.

TABLE 1

| | | FREQUENCY | | | |
|---|---|---|---|---|---|
| | | 3 GHz | 5 GHz | 10 GHz | 28 GHz |
| opening size g | 0.2 mm | 47.9 dB | 43.5 dB | 37.5 dB | 28.5 dB |
| | 0.5 mm | 40.0 dB | 35.5 dB | 29.5 dB | 20.5 dB |

The formula for calculating attenuation level G [dB] of the plane wave is:

$$G=20*\log(\lambda/2g) \text{ for } g \leq \lambda/2,$$

where λ [m] is wavelength (=300/frequency [MHz]) and g [m] is the opening size of the mesh.

Attenuation of more than 40 dB is generally required as shielding performance. The 40-dB attenuation is such a level that a mobile phone is out of range when put in a domestic microwave oven. As shown in Table 1, the estimated results no longer sufficiently satisfy the requirement.

In contrast to that, employing the wire mesh 40 having an opening size of 0.05 mm for the semiconductor device 1 of Embodiment 1, an attenuation level of 40 dB or more can be obtained even for the plane wave of 28 GHz, as shown in Table 2.

TABLE 2

| | | FREQUENCY | | | |
|---|---|---|---|---|---|
| | | 3 GHz | 5 GHz | 10 GHz | 28 GHz |
| opening size g | 0.05 mm | 60.0 dB | 55.5 dB | 49.5 dB | 40.5 dB |

In the semiconductor device 1, since the wire mesh 40 serving as an electromagnetic shield is encapsulated in the molded resins, although a model name and the like are laser-marked on a surface of the semiconductor device, the wire mesh is not irradiated with the laser, thus always bringing about a stable shielding effect as designed. Moreover, manufacturing the semiconductor device can be achieved such as by a transfer molding or injection molding without using a number of resin materials nor through complicated manufacturing steps, thus contributing to reduction of material cost, processing cost, and the like of the semiconductor device.

As described above, since the semiconductor device 1 according to Embodiment 1 includes the semiconductor chip 20 bonded to the surface of the substrate 10; the bonding wires 30 connecting the semiconductor chip 20 to the bond pads 101 formed on the surface of the substrate 10; the grounded pad 102 formed so as to surround the semiconductor chip 20 and the bond pads 101; the basket-shaped wire mesh 40 covering the semiconductor chip 20, the bonding wires 30, and the bond pads 101 and joined to the grounded pad 102; the first molded resin 510 containing the first insulating fillers 511 having particle sizes smaller than the opening size of the wire mesh 40 and sealing inside the wire mesh 40 the semiconductor chip 20, the bonding wires 30, and the bond pads 101; and the second molded resin 520 containing mainly the second insulating fillers 521 having particle sizes larger than the opening size of the wire mesh 40 and sealing outside the wire mesh 40 the semiconductor chip 20, the bonding wires 30, and the bond pads 101 via the first molded resin 510 and the wire mesh 40, the first molded resin formed inside the wire mesh becomes reduced in elastic modulus (becomes softer), thus being able to relieve the stress caused by heating during solder mounting such as by reflow soldering and to prevent occurrence of a package crack originated from the semiconductor chip. Moreover, since the second molded resin formed outside the wire mesh becomes to have a higher content of the fillers than the first molded resin and the average filler particle size also becomes larger than that of the first molded resin, the second molded resin becomes increased in elastic modulus (becomes harder), thus bringing about an effect of reducing warpage caused by heating during solder mounting.

Furthermore, since the method of manufacturing the semiconductor device 1 according to Embodiment 1 includes the step of bonding the semiconductor chip 20 to the surface of the substrate 10; the step of connecting the semiconductor chip 20 to the bond pads 101 formed on the surface of the substrate 10 using the bonding wires 30; the step of joining the basket-shaped wire mesh 40 for covering the semiconductor chip 20, the bonding wires 30, and the bond pads 101 to the grounded pads 102 formed on the surface of the substrate 10; the step of injecting into the cavity 602a through the gate 603 of the molding die 60 the resin material 50 containing the first insulating fillers 511 having particle sizes smaller than the opening size of the wire mesh 40 and the second insulating fillers 521 having particle sizes larger than the opening size of the wire mesh 40 after mounting the substrate 10 inside the molding die 60, to fill the space inside the wire mesh 40 with the first resin material 51 containing only the first insulating fillers 511 selectively separated by the wire mesh 40 and to fill the space outside the wire mesh 40 with the resin material 52 containing mainly the second insulating fillers 521; and the step of forming inside the wire mesh 40 the first molded resin 510 sealing the semiconductor chip 20, bonding wires 30, and the bond pads 101 and forming outside the wire mesh 40 the second molded resin 520 sealing the first molded resin 510 and the wire mesh 40, by thermally curing the resin materials 51, 52, the content of the fillers in the resin material for covering the semiconductor chip and the other parts becomes lower, whereby the viscosity is reduced and the flowability is improved during injection of the resin material, thus being able to prevent occurrence of scratches on the surface of the semiconductor chip and to prevent flexure and the like of the bonding wires.

Moreover, since not only shielding performance can be sufficiently ensured but also the wire mesh serving as an electromagnetic shield is encapsulated in the molded resins, although a model name and the like are laser-marked on a surface of the semiconductor device, the wire mesh is not irradiated with the laser, thus being able to always bringing about a stable shielding effect. Furthermore, manufacturing the semiconductor device can be achieved such as by a transfer molding or an injection molding without, using a number of resin materials nor through complicated manufacturing steps, thus contributing to reduction of material cost and processing cost of the semiconductor device.

Figure 7:
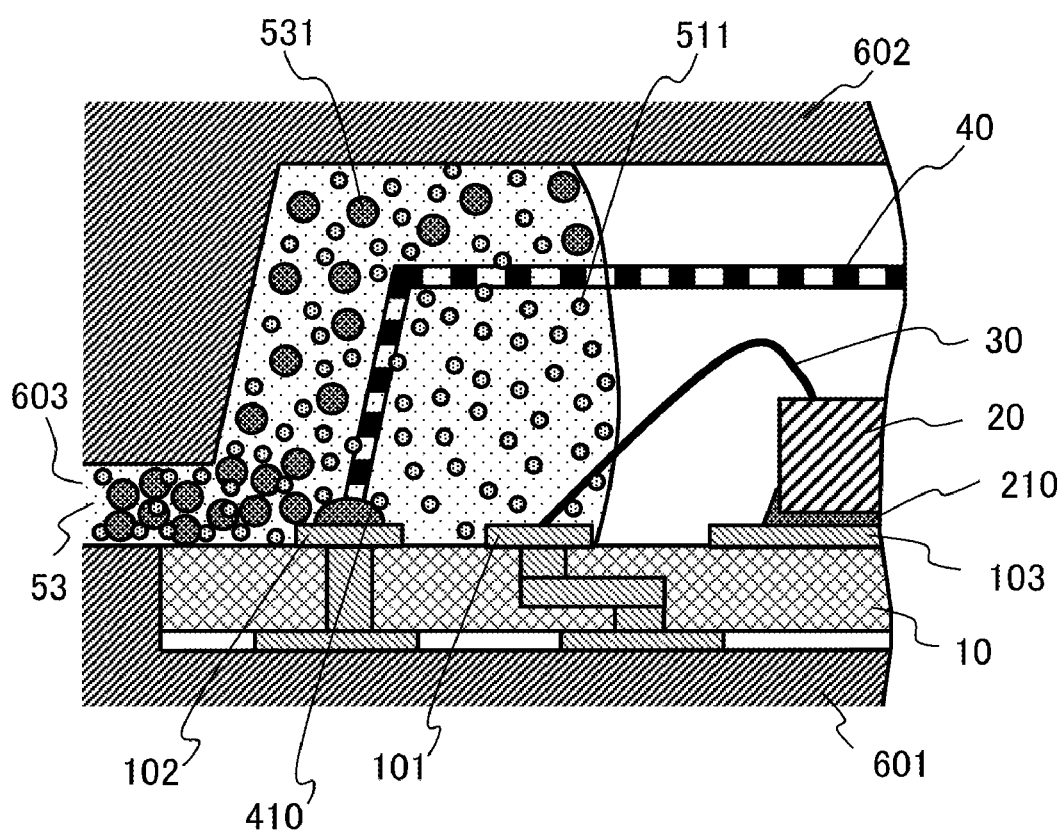
FIG. 7 is an enlarged sectional view illustrating one of the steps of manufacturing another semiconductor device according to Embodiment 1.
Figure 8:
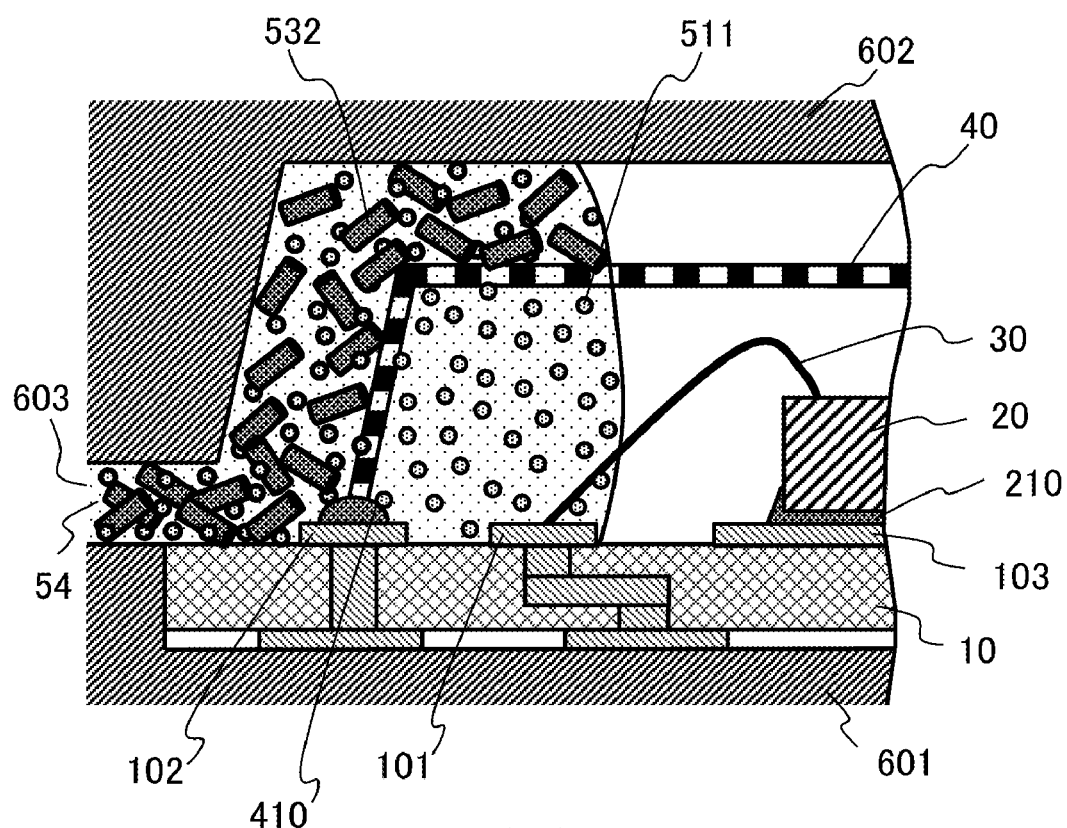
FIG. 8 is an enlarged sectional view illustrating one of the steps of manufacturing still another semiconductor device according to Embodiment 1.

While Embodiment 1 describes a case of using the resin material 50 containing the insulating fillers, the resin material is not limited to this. A resin material 53 may be used, as shown in FIG. 7, that contains the first insulating fillers 511 having particle sizes smaller than the opening size of the wire mesh 40 and first conductive fillers 531 having particle sizes larger than the opening size of the wire mesh 40. Furthermore, a resin material 54 may be used, as shown in FIG. 8, that contains the first insulating fillers 511 having particle sizes smaller than the opening size of the wire mesh 40 and second conductive fibrous fillers 532 having particle sizes (equivalent diameters) larger than the opening size of the wire mesh 40 and not passing the openings of the wire mesh 40.

The first conductive fillers 531 and the second conductive fillers 532 are in contact with the wire mesh 40 without passing through its openings. Moreover, the first conductive fillers 531 come into contact with each other and the second conductive fillers 532 also come into contact with each other, and the respective injected resin materials become a third molded resin and a fourth molded resin after thermally cured. That is, the third molded resin containing the first conductive fillers 531 and the fourth molded resin containing the second conductive fillers 532 have conductivity and are further in electrical connect with the wire mesh 40. Hence, the third molded resin containing the first conductive fillers 531 and the fourth molded resin containing the second conductive fillers 532 serve as an electromagnetic shield along with the wire mesh 40.

Thus, addition of the shielding performance by the third molded resin or the fourth molded resin each having conductivity to the shielding performance by the wire mesh 40 brings about a higher electromagnetic shielding performance. Furthermore, the surface of the semiconductor device that is molded with the resin material containing the conductive fillers has conductivity at completion of sealing with the molded resin. A compound semiconductor chip such as a GaAs chip is liable to be damaged by electrostatic discharge; hence, an anti-static measure by an ionizer is necessary even in the process of manufacturing the semiconductor device. Having conductivity on the surface of the semiconductor device at completion of the sealing is beneficial for prevention of electrostatic damage. This also enables further prevention of adhesion (attraction) of indoor dust in handling the semiconductor device.

Embodiment 2

While Embodiment 1 describes the case of using the basket-shaped wire mesh 40, Embodiment 2 describes a case of using a basket-shaped wire mesh with a peripheral flange.

Figure 9:
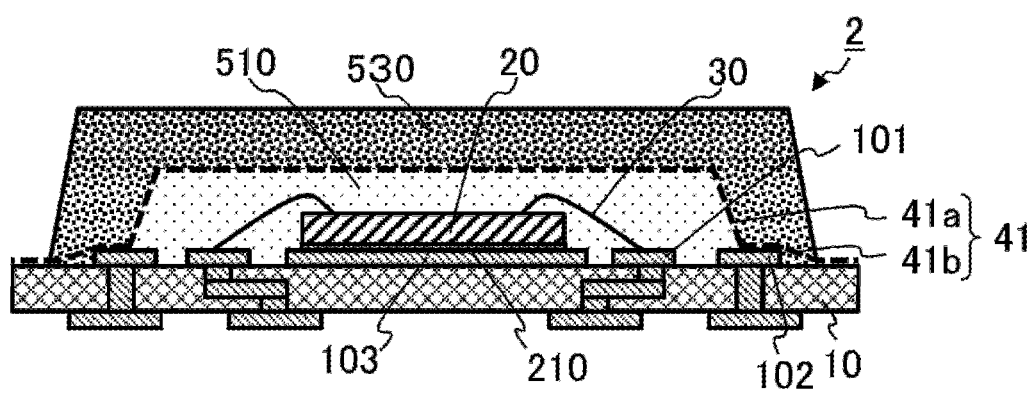
FIG. 9 is a sectional view showing a configuration of a semiconductor device according to Embodiment 2.
Figure 10A:
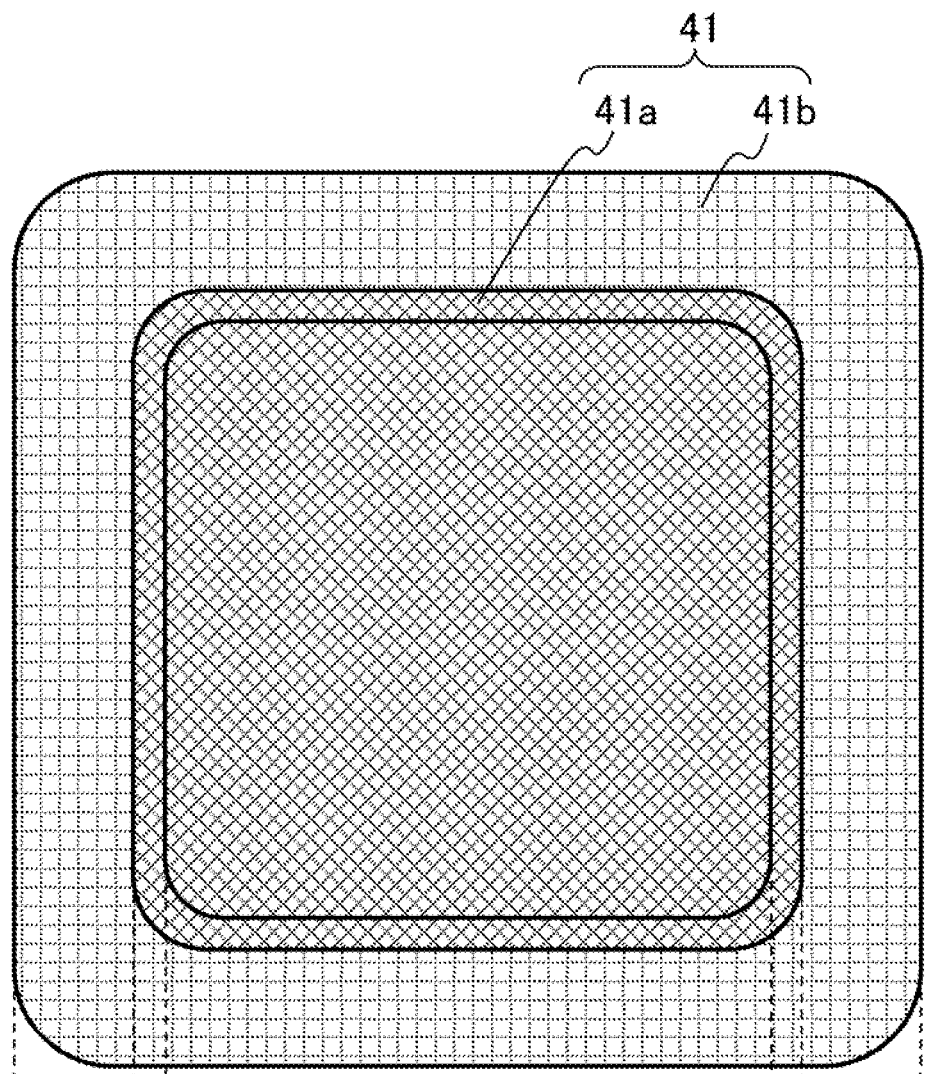
FIGS. 10A and 10B are a plan view and a side view showing a shape of a wire mesh used in the semiconductor device according to Embodiment 2.

FIG. 9 is a sectional view showing a configuration of a semiconductor device 2 according to Embodiment 2 of the present invention. FIG. 10A is a plan view of the wire mesh used in the semiconductor device 2, and FIG. 10B is a side view thereof.

Figure 10B:
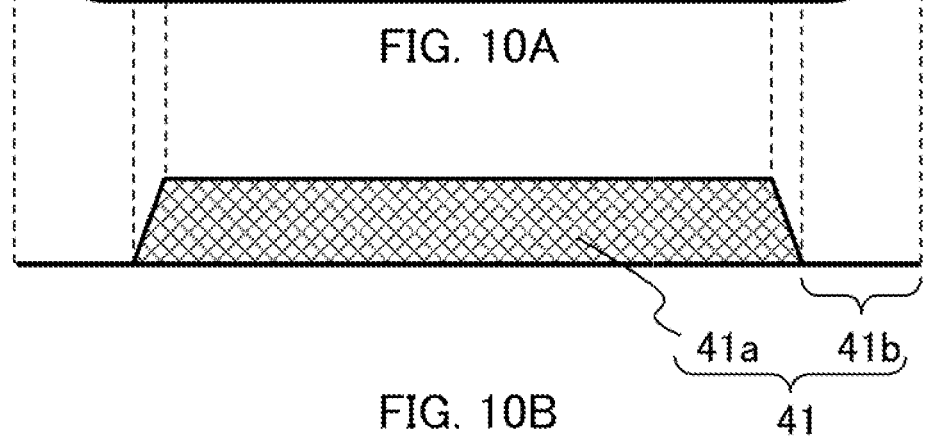

The wire mesh 41 used in the semiconductor device 2 is composed of a basket-shaped part 41a and a flange part 41b, as shown in FIG. 10A and FIG. 10B. Although the basket-shaped part 41a has an opening size that is larger than the particle sizes of the first insulating fillers contained in the resin material 53 and smaller than particle sizes of the first conductive fillers contained therein to form the molded resins, the flange part 41b has an opening size that is larger than the particle sizes of the first conductive fillers and allows both first conductive fillers and first insulating fillers to pass through. Preferably, the outer dimensions of the flange part 41b are the same as or smaller than those of the substrate 10 and are larger than those of the bottom of the molded resin 530. The configuration of the other components of the semiconductor device 2 of Embodiment 2 is the same as that of the semiconductor device 1 of Embodiment 1, and the corresponding components are designated at the same reference numerals and their descriptions are omitted.

Figure 11:
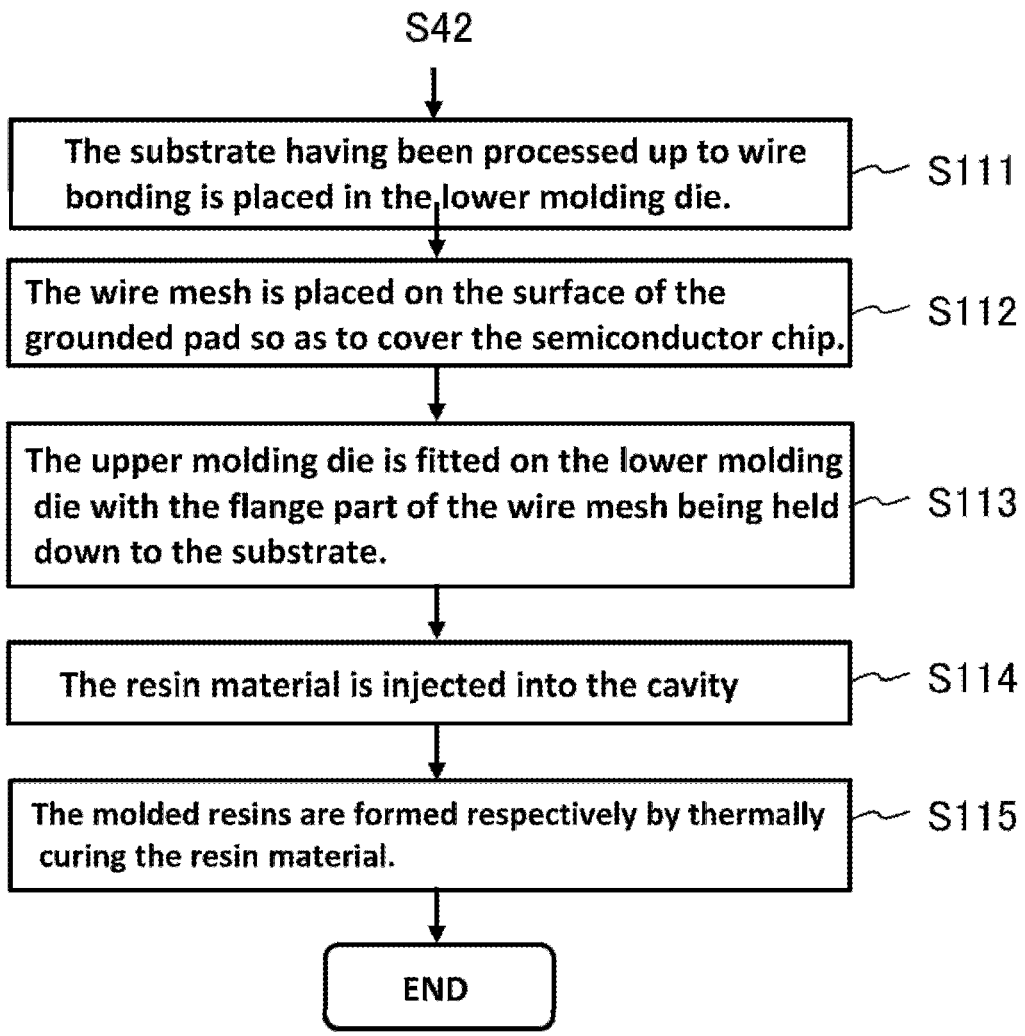
FIG. 11 is a flowchart showing steps of manufacturing the semiconductor device according to Embodiment 2.

Next, a method of manufacturing the semiconductor device 2 according to Embodiment 2 is described with reference to FIG. 11 to FIGS. 15A, 15B, 15C. FIG. 11 is a flowchart showing steps of manufacturing the semiconductor device 2 according to Embodiment 2. FIGS. 12A to 12D are sectional views respectively illustrating the steps of manufacturing the semiconductor device 2. FIG. 13 is an enlarged sectional view illustrating one of the steps of manufacturing the semiconductor device 2.

The initial steps of manufacturing the semiconductor device 2 of Embodiment 2 are the same as those from the step S41 up to the wire bonding step S42 shown in FIG. 4 of Embodiment 1 (from FIG. 5A up to FIG. 5B), and their descriptions are omitted.

Figure 12A:
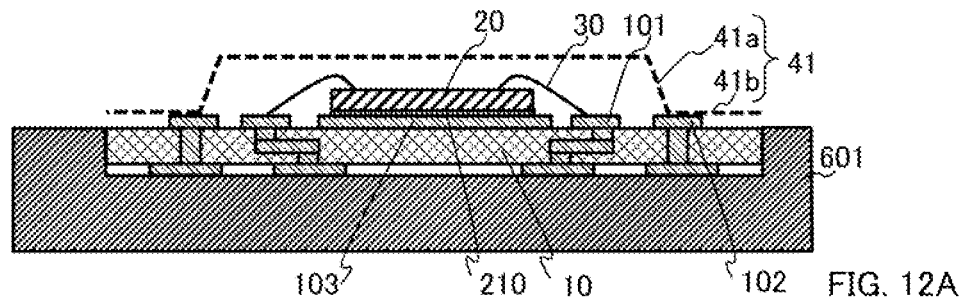
FIGS. 12A to 12D are sectional views respectively illustrating the steps of manufacturing the semiconductor device according to Embodiment 2.
Figure 13:
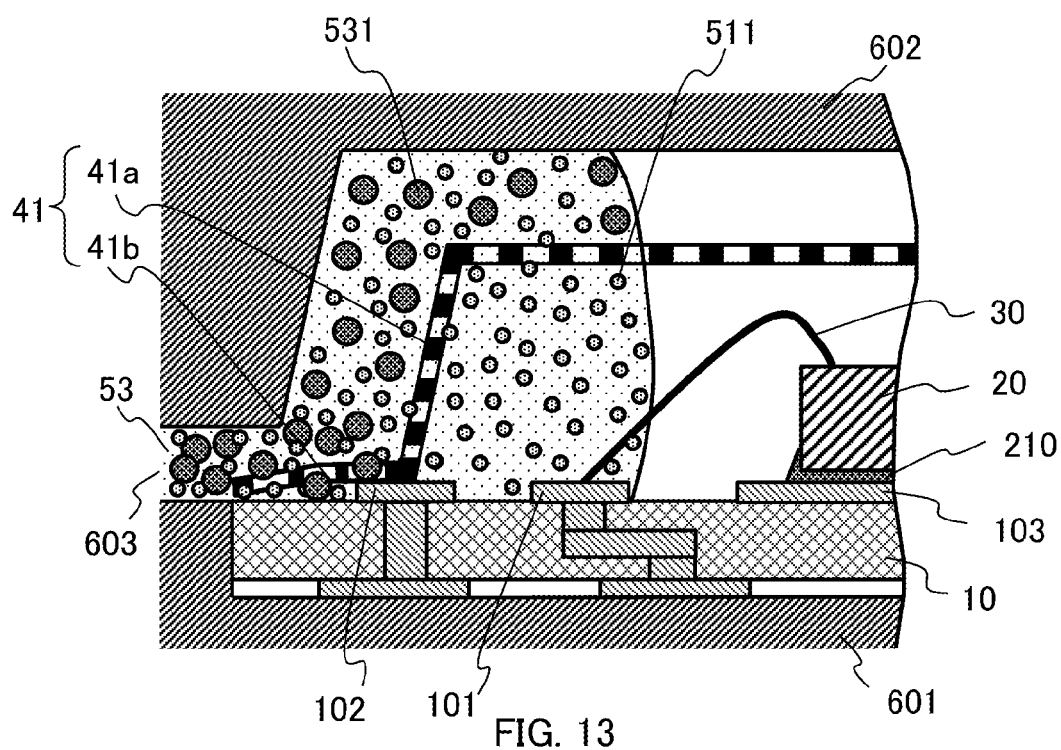
FIG. 13 is an enlarged sectional view illustrating one of the steps of manufacturing the semiconductor device according to Embodiment 2.

Subsequently, as shown in FIG. 12A, after the substrate 10 having been processed up to wire bonding is placed in the depression 601a of the first lower molding die 601 (Step S111 in FIG. 11), the wire mesh 41 having the flange part 41b is placed on the surface of the grounded pad 102 so as to cover the semiconductor chip 20, the bond pads 101, and the bonding wires 30 (Step S112 in FIG. 11). At this time, it is preferable that the bent portion for forming the flange part 41b of the wire mesh 41 be placed on the grounded pad 102.

Figure 12B:
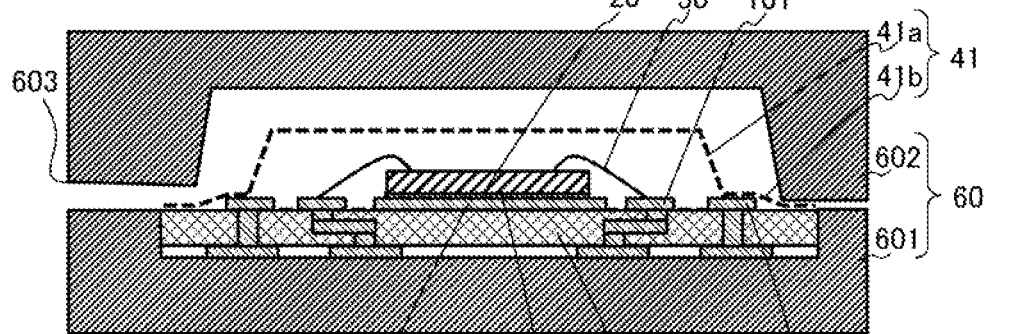

Next, the second upper molding die 602 is moved down and fitted on the first lower molding die 601 with the flange part 41b of the wire mesh 41 being held down to the peripheral surface of the substrate 10 so as to press the flange part against the surface of the grounded pad 102, as shown in FIG. 12B, (Step S113 in FIG. 11).

Figure 14:
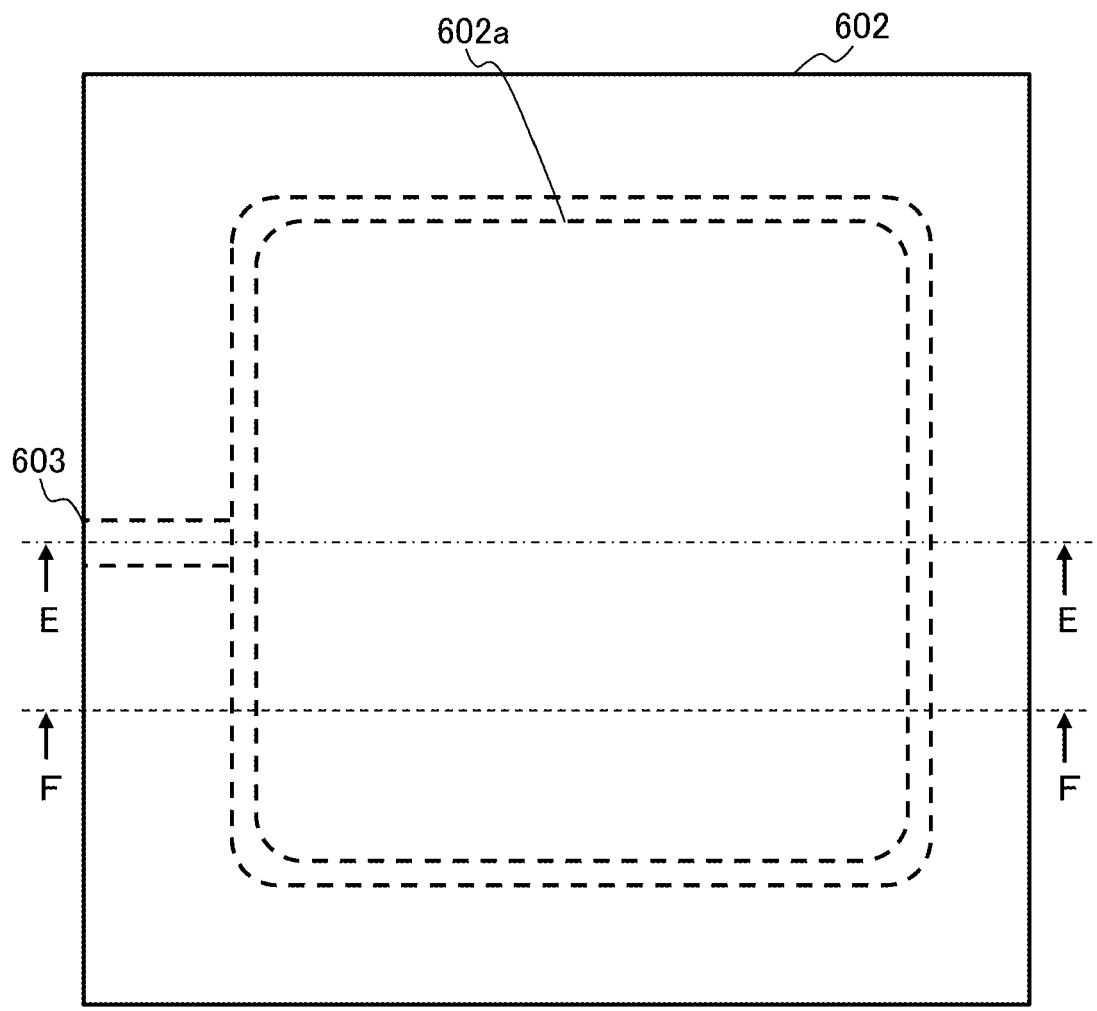
FIG. 14 is a plan view of a molding die used for molding the semiconductor device according to Embodiment 2.
Figure 15A:
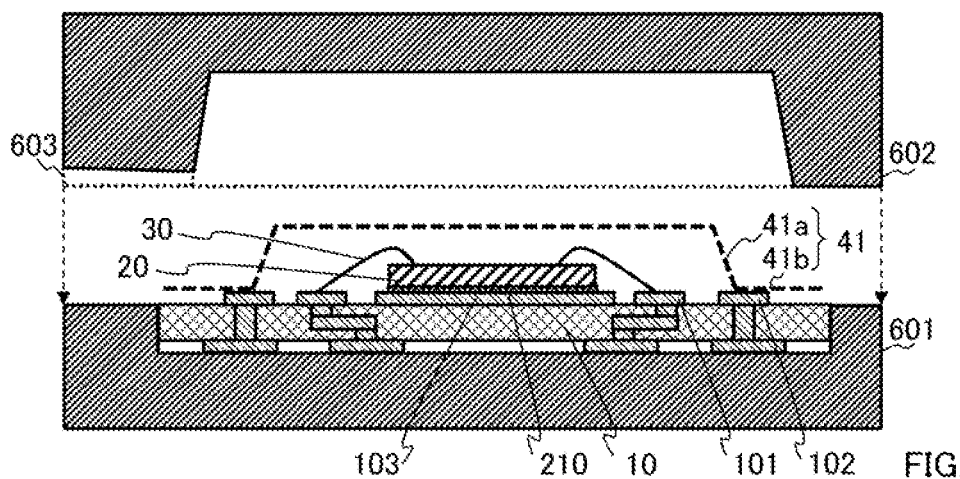
FIGS. 15A to 15C are sectional views respectively illustrating the steps of manufacturing the semiconductor device according to Embodiment 2.
Figure 15B:
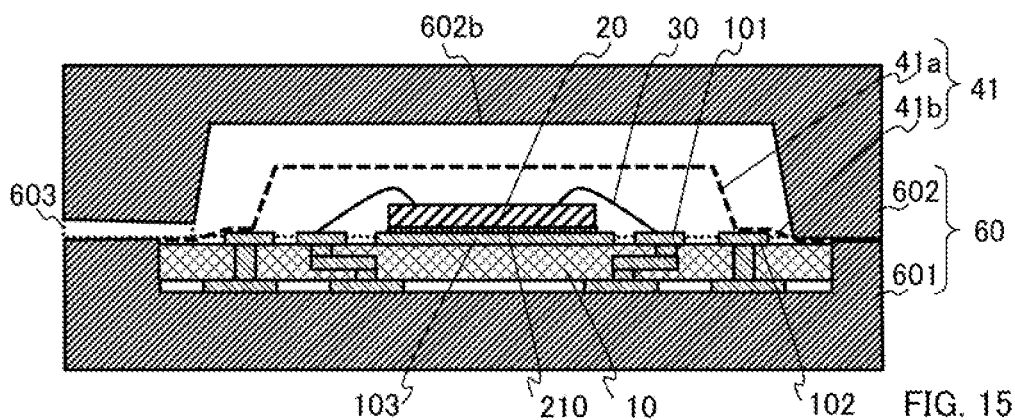
Figure 15C:
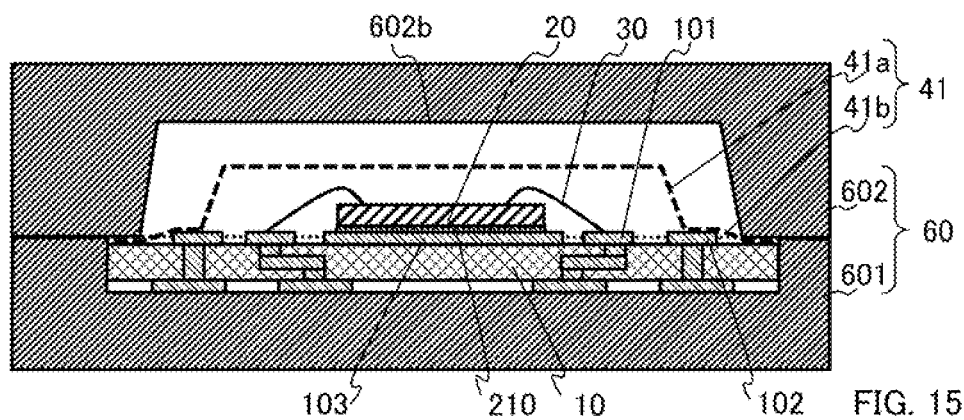

Note that the one (a few at most) gate 603 communicating to the cavity 602a is formed in the second upper molding die 602, as shown in FIG. 14. A portion located at the gate 603, of the flange part 41b of the wire mesh 41 is not directly held down to the surface of the substrate 10 by the second upper molding die 602, as shown in FIG. 15B, a sectional view taken in the direction of the arrows along line E-E in FIG. 14. Accordingly, the portion located at the gate 603 is in a state slightly lifted up from the upper surface of the substrate 10. However, since the width of the gate 603 is about 1 to 2 mm, which is small compared to the outer dimensions of the semiconductor device, the rest portion of the flange part is held down to the substrate 10 by the upper molding die 602 except for the gate 603 (see FIG. 15C, a sectional view taken in the direction of the arrows along line F-F in FIG. 14). As a result, the flange part 41b is brought into contact with the grounded pad 102 entirely along its surface.

Figure 12C:
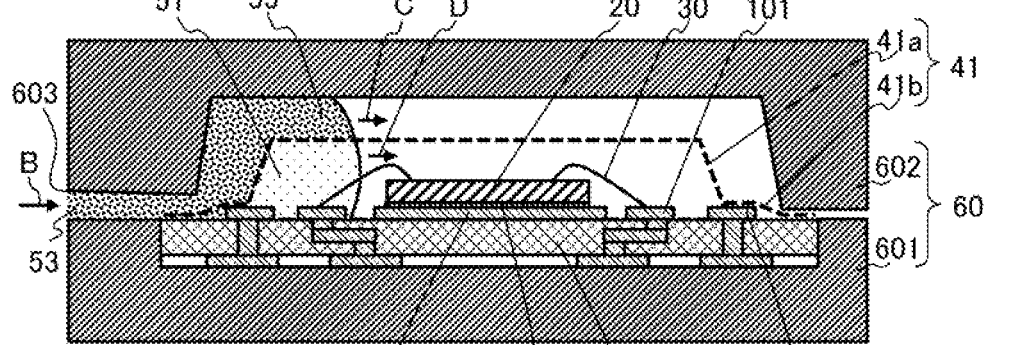

Subsequently, after the substrate 10 is mounted inside the molding die 60 with the wire mesh 41 being held down to the substrate, the resin material 53 is injected from the direction B into the cavity 602a through the gate 603, as shown in FIG. 12C (Step S114).

When the resin material 53 flowing and having passed through the gate 603 reaches the basket-shaped part 41a of the wire mesh 41, the first conductive fillers 531 contained in the resin material 53 are selectively separated by the basket-shaped part 41a, as shown in FIG. 13. Specifically, part of the first insulating fillers 511 smaller than the opening size of the basket-shaped part 41a of the wire mesh 41 passes through the openings thereof along with the organic resin and flows in the direction D as the first resin material 51 for covering the semiconductor chip 20 and the bonding wires 30, so that the space inside of the basket-shaped part 41a of the wire mesh 41 is filled with the first resin material 51. On the other hand, a resin material containing the rest of the small-size first insulating fillers 511 not having passed through the openings of the basket-shaped part 41a of the wire mesh 41 and containing the first conductive fillers 531 larger than the opening size of the basket-shaped part flows in the direction C as a third resin material 55 for covering the outside of the basket-shaped part 41a of the wire mesh 41, so that the space outside the basket-shaped part 41a of the wire mesh 41 is filled with the third resin material 55. Moreover, since the flange part 41b of the wire mesh 41 has the opening size larger than the particle sizes of the first conductive fillers 531, part of the first conductive fillers 531 pass through the flange part and come into contact with the grounded pad 102 formed on the substrate 10.

Figure 12D:
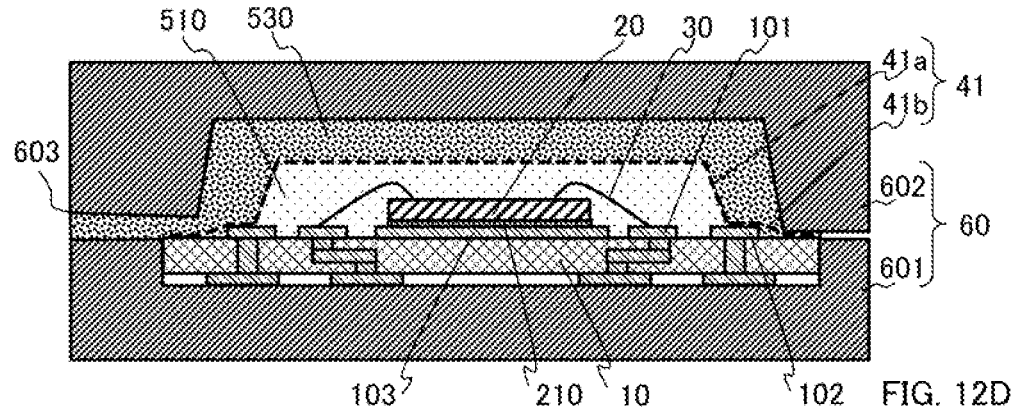

Finally, after the cavity is fully filled with the first resin material 51 and the third resin material 55 each injected as the resin material 53, the first molded resin 510 directly sealing the semiconductor chip 20 and the bonding wires 30 and the third molded resin 530 indirectly sealing them from outside the wire mesh 41 are formed respectively by thermally curing the first resin material 51 and the third resin material 53, as shown in FIG. 12D (Step S115).

At this time, the part of the first conductive fillers 531 having passed through the flange part 41b of the wire mesh 41 come into contact with the grounded pad 102 and the first conductive fillers 531 are also in contact with each other. Thus, the third molded resin 530 formed by thermally curing the third resin material 55 and containing the first conductive fillers 531 has conductivity and is further in electrical connection to the grounded pad 102. Hence, the third molded resin containing the first conductive fillers 531 serves as an electromagnetic shield.

Since the third molded resin 530 containing the first conductive fillers 531 is formed in this way from the resin material 53 containing the first conductive fillers 531 selectively separated by the wire mesh 41 with the flange part 41b having the opening size larger than the particle sizes of the first conductive fillers 531, fixation and electrical connection of the wire mesh can be achieved by the molding without fixing and electrically connecting the wire mesh such as by soldering or joining in advance. Furthermore, the material cost and the processing cost can be reduced, thus being able to provide the semiconductor device at a low price.

As described above, the method of manufacturing the semiconductor device 2 according to Embodiment 2 includes the step of bonding the semiconductor chip 20 to the surface of the substrate 10; the step of connecting the semiconductor chip 20 to the bond pads 101 formed on the surface of the substrate 10 using the bonding wires 30; the step of placing on the grounded pad 102 formed on the surface of the substrate 10 the wire mesh 41 having the flange part 41b and the basket-shaped part 41a for covering the semiconductor chip 20 and the bonding wires 30, and the bond pads 101, after placing the substrate 10 on the first lower molding die 601; the step of fitting the second upper molding die 602 on the first lower molding die 601 with the flange part 41b being held down to the substrate 10; the step of injecting, into the cavity 602a through the gate 603 formed between the first lower molding die 601 and the second upper molding die 602, the resin material 53 containing the first insulating fillers 511 having particle sizes smaller than the opening size of the basket-shaped part 41a and the first conductive fillers 531 having particle sizes larger than the opening size of the basket-shaped part 41*a*, to fill the space inside the basket-shaped part 41*a* with the resin material 51 containing only the first insulating fillers 511 selectively separated by the basket-shaped part 41*a* and to fill the space outside the basket-shaped part 41*a* with the third resin material 55 containing mainly the first conductive fillers 531; and the step of forming inside the basket-shaped part 41*a* the first molded resin 510 sealing the semiconductor ship 20, the bonding wires 30, and the bond pads 101, and forming outside the basket-shaped part the third molded resin 530 sealing the first molded resin 510 and the wire mesh 41 by thermally curing the resin materials 51, 55, thus enabling not only the effects of Embodiment 1 to be brought about but also the fixation and the electrical connection of the wire mesh to be achieved by the molding without fixing and electrically connecting the wire mesh such as by soldering or joining in advance. Furthermore, the material cost and the processing cost can be reduced, thus being able to provide the semiconductor device at a low price.

Note that the first conductive fillers 531 are used as conductive fillers in Embodiment 2, but the conductive fillers are not limited to the first ones. The second conductive fibrous fillers 532 may be used. Also in this case, the same effect can be brought about.

Although the present application describes various exemplary embodiments and implementations, it should be understood that various features and aspects and functionalities described in one or more of the individual embodiments are not limited to their applicability to the specific embodiment but instead can be applied alone or in various combinations to one or more of the embodiments. Therefore, numerous modifications that have not been exemplified are conceivable without departing from the technical scope disclosed in the specification of the present application. For example, at least one of the constituent components may be modified, added, or eliminated, and further at least one of the constituent components mentioned in at least one of the preferred embodiments may be selected and combined with the constituent elements mentioned in another preferred embodiment.

REFERENCE NUMERALS

1, 2: semiconductor device;
10: substrate;
40: semiconductor chip;
30: bonding wires;
40: wire mesh;
41*a*: basket-shaped part;
41*b*: flange part;
101: bond pads;
102: grounded pad;
50, 51, 52, 53, 54, 55: resin material;
510, 520, 530: molded resin;
511, 521: insulating fillers; and
531, 532: conductive fillers.

The invention claimed is:

1. A semiconductor device comprising:
a semiconductor chip bonded to a surface of a substrate;
bonding wires connecting the semiconductor chip to bond pads formed on the surface of the substrate;
a grounded pad formed so as to surround the semiconductor chip and the bond pads;
a basket-shaped wire mesh covering the semiconductor chip, the bonding wires, and the bond pads and joined to the grounded pad;
a first molded resin containing first fillers having particle sizes smaller than an opening size of the wire mesh and sealing, inside of the wire mesh, the semiconductor chip, the bonding wires, and the bond pads; and
a second molded resin containing second fillers having particle sizes larger than the opening size of the wire mesh and sealing, outside the wire mesh and via the first molded resin and the wire mesh, the semiconductor chip, the bonding wires, and the bond pads.

2. The semiconductor device of claim 1, wherein the first fillers and the second fillers are insulating fillers.

3. The semiconductor device of claim 1, wherein the first fillers are the insulating fillers and the second fillers contain conductive fillers.

4. The semiconductor device of claim 1, wherein the second fillers are conductive fibrous fillers.

5. The semiconductor device of claim 3, wherein the wire mesh have a flange part.

6. The semiconductor device of claim 4, wherein the wire mesh have a flange part.

* * * * *